United States Patent
Clevenger et al.

(10) Patent No.: US 6,448,173 B1
(45) Date of Patent: Sep. 10, 2002

(54) ALUMINUM-BASED METALLIZATION EXHIBITING REDUCED ELECTROMIGRATION AND METHOD THEREFOR

(75) Inventors: Lawrence Alfred Clevenger, Lagrangeville; Ronald Gene Filippi, Wappinger Falls, both of NY (US); Kenneth Parker Rodbell, Sandy Hook, CT (US); Roy Charles Iggulden, Newburgh, NY (US); Chao-Kun Hu, Somers, NY (US); Lynne Marie Gignac, Beacon, NY (US); Stefan Weber, Dresden (DE); Jeffrey Peter Gambino, Westford, VT (US); Rainer Florian Schnabel, Hoehenkirchen (DE)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/589,546

(22) Filed: Jun. 7, 2000

(51) Int. Cl.[7] ...................... H01L 21/4763; H01L 21/44

(52) U.S. Cl. ....................... 438/627; 438/688

(58) Field of Search ................. 438/627, 688

(56) References Cited

U.S. PATENT DOCUMENTS

| | | | |
|---|---|---|---|
| 5,470,788 A | 11/1995 | Biery et al. | 437/190 |
| 5,488,013 A | 1/1996 | Geffken et al. | 437/187 |
| 6,169,030 B1 * | 1/2001 | Naik et al. | 438/680 |

OTHER PUBLICATIONS

Morita et al., "CVD/PVD Al filling process with Ti/TiN liner for dual damascene interconnections" in Proceedings of the Advanced Metallization Conference in 1998 (AMC 1998), pp. 427–432.*

Iggulden et al. "An advanced 4 level BEOL process with 3 levels of minimum pitch dual damascene wiring (W, Al, Al) for 0.175 micron giga–scale" in Proceeding of the LSI Multilevel Interconnection Conference (Jun. 1988) p. 19.*

Kusuyama et al. "A new test structure to study electromigration at grain boundaries using the single–crystal aluminum interconnection" in Proceedings of the 1995 International Conference on Microelectronic Test Structures, 1995 (Mar. 22–25, 1995) pp. 225–.*

Byun, et al. "Enhanced EM endurance of TiN/AlCu/TiNx interconnection" in Integrated Reliability Workshop, 1994, (Oct. 16–19, 1994); p. 144.*

Hinode et al. "Improvement of electromigration resistance of layered aluminum conductors" in International Proceedings of Reliability Physics Symposium, 1990. 28th Annual (Mar. 27–29, 1990), pp. 25–30.*

(List continued on next page.)

*Primary Examiner*—Olik Chaudhuri
*Assistant Examiner*—Erik Kielin
(74) *Attorney, Agent, or Firm*—Marian Underweiser; Gary M. Hartman; Domenica N. S. Hartman

(57) ABSTRACT

A dual damascene process capable of reliably producing aluminum interconnects that exhibit improved electromigration characteristics over aluminum interconnects produced by conventional RIE techniques. In particular, the dual damascene process relies on a PVD-Ti/CVD-TiN barrier layer to produce aluminum lines that exhibit significantly reduced saturation resistance levels and/or suppressed electromigration, particularly in lines longer than 100 micrometers. The electromigration lifetime of the dual damascene aluminum line is strongly dependent on the materials and material fill process conditions. Significantly, deviations in materials and processing can result in electromigration lifetimes inferior to that achieved with aluminum RIE interconnects. In one example, current densities as high as 2.5 MA/cm$^2$ are necessary to induce a statistically relevant number of fails due to electromigration.

12 Claims, 4 Drawing Sheets

OTHER PUBLICATIONS

Setlik et al. "Electromigration investigations of aluminum alloy interconnects" in Proceedings of the Twelfth Biennial University/Government/Industry Microelectronics Symposium, 1997 (Jul. 20–23, 1997) pp. 159–160.*

Clevenger et al. "A novel low temp CVD/PVD Al filling process for producing highly reliable 0.175 □m Dwring /0.35 □DM pitch dual damascene interconnections in gigabit scale DRAMS" Proceeding of International Interconnect Technology Conference (Jun. 1998).*

Proost, et al, *Electromigration Threshold in Damascene Versus Plasma–etched Interconnects*, Journal of Applied Physics, Nov. 1998, pp. 2748–2750.

Blech, I.A., *Electromigration in Thin Aluminum Films on Titanium Nitride*, Journal of Applied Physics, Apr. 1976, pp. 1203–1208.

Hu, C.K., et al, *Electromigration in Al(Cu) Two–Level Structures: Effect of Cu and Kinetics of Damage Formation*, Journal of Applied Physics, Jul. 1993, pp. 969–978.

Filippi, R, et al, *The Effect of Current Density and Stripe Length on Resistance Saturation During Electromigration Testing*, Journal of Applied Physics, Oct. 1996, pp. 2350–2352.

Schnabel, R.F., et al, *Electromigration in Aluminum Damascene Lines*, Fifth International Workshop on Stress–Induced Phenomena in Metallization, Stuttgart, Germany, Jun. 1999.

* cited by examiner

ALUMINUM-BASED METALLIZATION EXHIBITING REDUCED ELECTROMIGRATION AND METHOD THEREFOR

BACKGROUND OF THE INVENTION

1. Field of the Invention

The present invention generally relates to aluminum-based metallizations for integrated circuits. More particularly, this invention relates to a process of forming aluminum-based metallizations that exhibit improved life as a result of being less prone to electromigration.

2. Description of the Prior Art

Aluminum conductors (lines) are widely used as metal interconnects between active devices of semiconductor microcircuits. Although most aluminum interconnects in current integrated circuits (ICs) are formed by reactive ion etching (RIE) of aluminum deposited by physical vapor deposition (PVD), there has been much recent interest in forming aluminum interconnects through the use of damascene processes. As known in the art, while RIE techniques entail depositing and then patterning metal, damascene processes generally entail etching a submicron trench in a dielectric material (e.g., $SiO_2$), and then filling the trench with a conductive material, such as aluminum, copper or tungsten. Excess conductive material is removed from the surface of the dielectric material by chemical-mechanical polishing (CMP) to produce a planar surface with a conductive line embedded in the dielectric material. Dual damascene involves simultaneously etching and filling a trench and one or more interlevel vias with a conductive material to form a conductive line and vias embedded in the dielectric material. The conductive material is again planarized by CMP to produce a planar surface on the embedded conductive line and vias.

Although a relatively more mature technique for IC interconnects, metal RIE techniques are becoming more difficult for a number of reasons, including higher aspect ratios for metal etching and oxide gap fill, as well as smaller overlay tolerances and the difficulty of etching aluminum alloys (especially Al-Cu alloys). Dual damascene processes avoid some of these problems, and offer a potential for lower cost by eliminating the use of tungsten studs as the via material. Of course, the lower cost made possible by a dual damascene process can only be realized if high yielding processes are developed for via and trench patterning, high aspect ratio metal fill, and chemical mechanical polishing of aluminum. An important consideration in this comparison is the electromigration properties of aluminum lines formed by the two methods. Aluminum lines are known to be subject to deterioration from electromigration, which is generally the movement of atoms caused by the interaction between electrons and ions in the presence of an electric current. In multilayered interconnections, a typical mode of failure from electromigration within an aluminum line is an excessive resistance increase due to the depletion of aluminum atoms from the cathode end and accumulation of aluminum atoms at the anode end. Enriching the grain boundaries and external interfaces of an aluminum line with copper has been employed to improve the electromigration resistance of aluminum lines by retarding aluminum diffusion.

A diffusion barrier formed along the external interfaces of an aluminum line has also been reported to reduce aluminum electromigration by inducing a stress gradient that, once sufficiently large as a result of the accumulation of aluminum atoms at the anode end of the line, opposes the electromigration driving force for aluminum migration toward the anode end. Examples of known diffusion barriers include a titanium layer alone or in combination with a titanium nitride layer, both typically deposited by physical vapor deposition (PVD). In short interconnections, this stress gradient causes the resistance increase to saturate with time, or otherwise reach some maximum value. This resistance change at saturation is known to depend on current density (j) and line length (L), such that the current density and line length product (jL) has been used as a parameter for assessing this phenomenon.

In the case of interconnections patterned by RIE techniques and terminated by tungsten studs, resistance saturation effects are most evident for line lengths of about 100 micrometers and less, with the result that relatively low saturation resistances tend to occur even with relatively high current densities. A critical current density x line length product (jL) of as low as 1020 A/cm has been reported for RIE aluminum interconnects, above which excessive resistance increases occur. However, for line lengths greater than 100 micrometers, the critical current density x line length parameter does not apply, and current densities must be maintained at significantly lower levels in order to yield resistance saturation levels comparable to those exhibited by lines shorter than 100 micrometers. For example, current densities (j) above about 2 $MA/cm^2$ can cause an excessive saturation resistance in a RIE aluminum line having a length of 100 micrometers or more.

Another apparent factor in electromigration through RIE interconnects is the fiber texture of the metal line. As known in the art, texture is the orientation (crystallographic) of the polycrystalline grains in the metal line, and describes how similar the orientations are. Fiber texture is typically found in thin films since the orientation of the grains is symmetric about the film normal. Metal RIE structures having randomly textured lines generally have shorter electromigration lives than those that are strongly textured. There is evidence that a correlation exists between a pronounced texture of the metal line grains and the formation of undesirable aluminum intermetallics, such as $TiAl_3$ that form as a reaction product of an aluminum line and a titanium diffusion barrier.

In the comparison of the electromigration properties of RIE and damascene lines, previous studies have provided seemingly contradictory results. Some research has concluded that lines formed by damascene processes have a fundamentally improved electromigration performance over RIE lines, while other research suggests that in some cases metal lines formed by RIE can outperform the electromigration characteristics of metal lines formed by dual damascene. Nonetheless, occurrence of the saturation resistance phenomenon in RIE aluminum lines is typically limited to line lengths of less than 100 micrometers. Therefore, it would be desirable if a metallization scheme were available that reduces the resistance saturation level or totally suppressed electromigration in aluminum lines having lengths greater than 100 micrometers.

SUMMARY OF THE INVENTION

According to the present invention, there is provided a dual damascene process capable of reliably producing aluminum interconnects that exhibit improved electromigration characteristics over aluminum interconnects produced by conventional RIE techniques. In particular, the dual damascene process of this invention produces aluminum lines that exhibit significantly reduced saturation resistance levels and/or suppressed electromigration, particularly in lines longer than 100 micrometers. The invention evidences that the electromigration lifetime of a dual damascene aluminum line is strongly dependent on the materials and material fill process conditions. Significantly, deviations in materials and processing can result in electromigration lifetimes inferior to that achieved with aluminum RIE interconnects. However, the dual damascene process of this invention has been shown to provide electromigration reliability that is far better than any previously reported work for aluminum RIE interconnects. In one example, a current density as high as 2.5 MA/cm$^2$ is necessary in damascene aluminum lines with lengths of 200 micrometers to induce a statistically relevant number of fails due to electromigration.

According to this invention, a dual damascene technique is employed to produce a metal line that interconnects two electrically-conductive regions spaced laterally apart, such as metallizations in other levels of a multilayered circuit. The technique entails forming vias that extend through a dielectric material to the electrically-conductive regions, and forming a trench in the dielectric material to be contiguous with the vias but without extending through the dielectric material. The trench and vias are then filled to form a dual damascene metallization structure which is terminated at opposing ends thereof by the electrically-conductive regions. The trench and vias are filled by first depositing a layer of titanium by physical vapor deposition (PVD) on surfaces of the dielectric material within the vias and trench and on those surfaces of the electrically-conductive regions exposed within the vias. A layer of titanium nitride is then deposited by chemical vapor deposition (CVD) on the surface of the PVD titanium layer, and a layer of aluminum is deposited by CVD on the surface of the CVD titanium nitride layer. Finally, an aluminum-containing alloy is deposited by PVD (PVD Al alloy) on the surface of the CVD aluminum layer so that the aluminum-containing layers (CVD Al and PVD Al alloy) are separated from the titanium layer by the titanium nitride layer.

According to the invention, dual damascene aluminum lines produced by the process of this invention exhibit significantly reduced resistance saturation levels, and in some cases fully suppressed electromigration for line lengths greater than 100 micrometers. The process is also useful for breaking a long aluminum line into shorter lines at multiple metal levels, each line being capable of resistance saturation levels far less than the longer line they replace. While not wishing to be held to any particular theory, it is believed that the improved electromigration lifetime of a dual damascene aluminum line is due in part to the near elimination of a Ti-Al reaction zone that leads to the formation of a TiAl$_3$ reaction layer within the Al- containing alloy, which if present can significantly reduce the bulk thickness of the Al-containing alloy. Surprisingly, the texture of the Al-containing alloy does not appear to be a factor in electromigration life, in that aluminum damascene lines with almost random textures have exhibited long lifetimes with no significant TiAl$_3$ formation.

Other objects and advantages of this invention will be better appreciated from the following detailed description.

DETAILED DESCRIPTION OF THE PREFERRED EMBODIMENT

Figure 1:
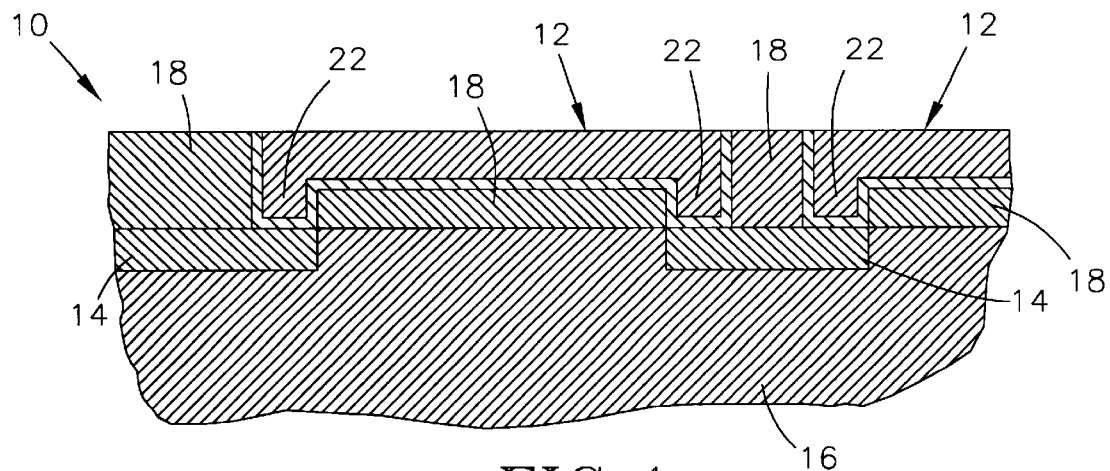
FIGS. 1 and 2 schematically represent lengthwise sectional views of dual damascene aluminum lines in accordance with two embodiments of this invention.
Figure 2:
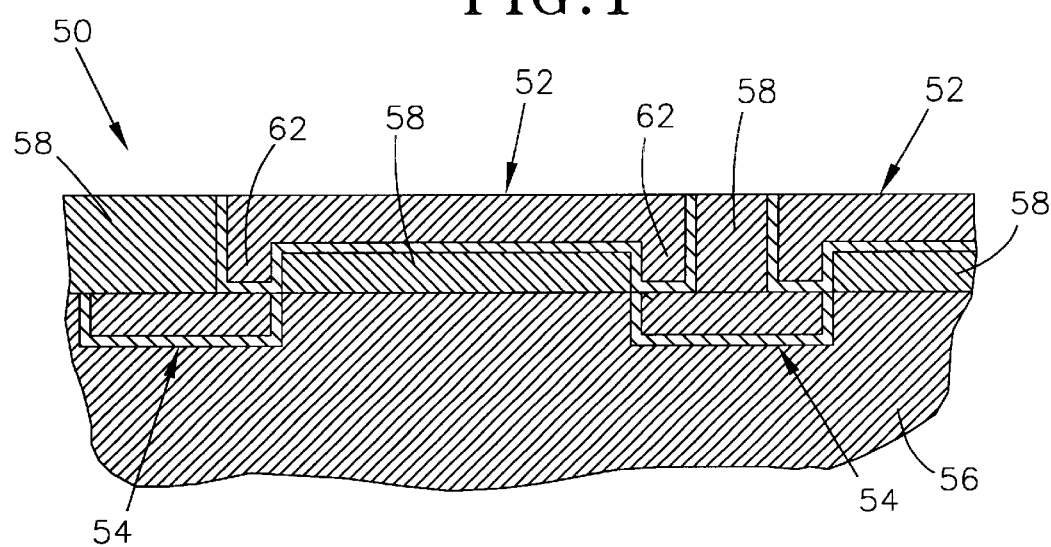

FIGS. 1 and 2 schematically represent two embodiments of aluminum lines (e.g., IC interconnects) formed by a dual damascene process that improves the electromigration properties of aluminum lines, particularly for lines longer than 100 micrometers. According to this invention, the electromigration lifetime of a dual damascene aluminum line is strongly dependent on the metal stack and metal fill process conditions. While non-ideal processes result in electromigration lifetimes inferior to values that can be obtained with RIE aluminum lines, the dual damascene process of this invention achieves electromigration reliability that is much better than any reported for RIE aluminum lines. While the invention will be described in reference to aluminum lines having particular test configurations, those skilled in the art will appreciate that the benefits of this invention can be applied to numerous other configurations that are within the scope of this invention.

In FIGS. 1 and 2, multilevel interconnects 10 and 50, respectively, are shown as being formed of upper-level aluminum lines 12 and 52, respectively, formed by a dual damascene process in accordance with this invention. In FIG. 1, the upper-level aluminum lines 12 are interconnected by lower-level interconnects 14 of tungsten lines, though copper or another suitable conductive material could be used. In contrast, the upper level aluminum lines 52 of FIG. 2 are interconnected by lower-level interconnects 54 in the form of aluminum lines formed by the same dual damascene process as that used to form the upper-level aluminum lines 52. The lower-level interconnects 14 and 54 enable any number of the upper-level aluminum lines 12 and 52 to be used in place of a long single line. The lower-level interconnects 14 and 54 are shown as being formed within trenches etched into the surface of a substrate 16 and 56, which may be a dielectric material such as silicon dioxide. In accordance with damascene processing, the trenches can be formed by any suitable etching technique, and then filled with the conductive material for the interconnects 14 and 54. The excess conductive material is then removed from the surface of the substrate 16/56 by chemical-mechanical polishing (CMP). According to dual damascene techniques, a layer 18/58 of dielectric material (e.g., TEOS silicon dioxide) is then deposited and etched to form trenches and vias for the upper-level aluminum lines 12 and 52, each of which is terminated by filled vias 22 and 62, respectively for interconnection to their respective lower-level interconnects 14 and 54. The thickness of the dielectric layers 18 and 58 are generally on the order of about 2000 to about 6000 angstroms, though lesser and greater thicknesses are foreseeable. The aluminum lines 12 and 52 are planarized by CMP, producing planar dielectric surfaces with the embedded interconnects 10 and 50, respectively. The particular etching and planarizing methods that can be used to form the interconnections of this invention are generally those practiced in the art, and therefore will not be discussed in further detail.

Figure 3:
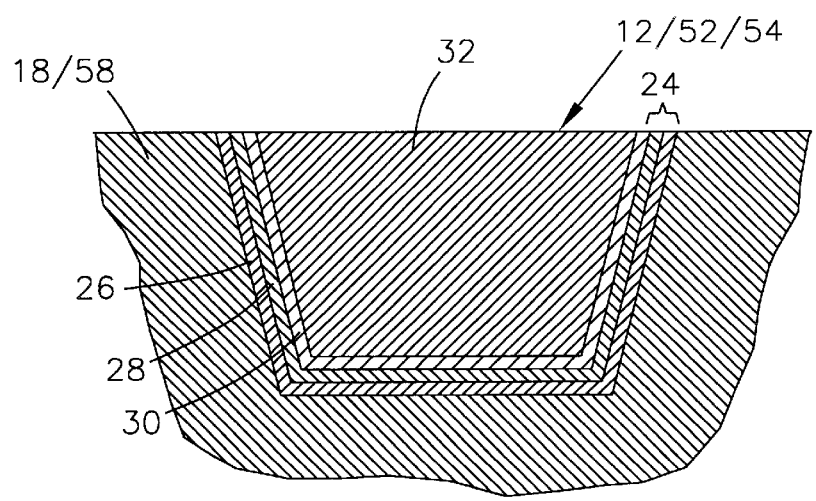
FIG. 3 schematically represents a cross-sectional view of any one of the dual damascene aluminum lines of FIGS. 1 and 2.

FIG. 3 is schematically representative of the cross-sections of the upper-level aluminum lines 12 and 52 of FIGS. 1 and 2, as well as the lower-level interconnect 54 of FIG. 2. As is apparent from FIG. 3, the dual damascene process of this invention provides each of the lines 12 and 52 and the lower-level interconnect 54 with a diffusion barrier 24 formed by two layers 26 and 28, while a thin aluminum layer 30 and a thicker aluminum or aluminum alloy conductor 32 constitute the conductive regions of the lines 12 and 52 and interconnect 54. A suitable alloy for the conductor 32 is aluminum alloyed with up to about 1.7 atomic percent (4 weight percent) copper, though greater and lesser copper concentrations and additional or alternative alloying additions of silicon, etc., are within the scope of the invention. According to the invention, the compositions of the layers 26 and 28 and the manner in which they and the aluminum layer 30 and conductor 32 are deposited appear to be critical to obtaining an electromigration lifetime better than that reported for RIE aluminum lines. The lowermost member of the diffusion barrier 24 (contacting the wall of the trench) is a titanium layer 26 deposited by physical vapor deposition (PVD), and the upper layer is a titanium nitride (TiN) layer 28 deposited by chemical vapor deposition (CVD) at about 350° C. to 450° C. The aluminum layer 30 is a seed layer for which good step coverage is desired, and therefore is a "low temperature" film deposited by CVD at generally below about 300° C. The aluminum alloy conductor 32 is preferably deposited by PVD at a temperature that is sufficiently high to promote atom mobility, yet less than about 375° C. to 450° C. in order to minimize the formation of $TiAl_3$ intermetallic.

According to this invention, dual damascene aluminum line specimens formed by the materials and processes noted above have exhibited improvements in electromigration lifetime by a factor of 3.3 over equivalent RIE aluminum lines for a stress current density of 2 $MA/cm^2$. The improvement in electromigration lifetime obtained by dual damascene aluminum lines formed in accordance with this invention appears to be due at least in part to the CVD TiN layer 28 as a result of its low defect density, smooth interfaces, and low tensile stresses resulting in a minimal number of nucleation sites for voids. The TiN layer 28 also does not provide a fast aluminum migration path, such as an etched $Al-SiO_2$ interface or an $Al-TiAl_3$ interface. Dual damascene aluminum lines of this invention can exhibit an extraordinarily long resistance incubation time, which appears to depend on the line length and whether or not a via terminates the anode end of the line. The product of current density (j) and line length (L) for lines that fail from electromigration has been observed to be above 10,000 A/cm and as high as 40,000 A/cm. The dense bulk of the aluminum conductor 32 and a low aluminum diffusivity possibly account for this short length effect, which does not necessarily result from the build-up of high back stress responsible for the resistance saturation effect associated with prior art aluminum line metallizations. Also of significance is that the failure mechanism in dual damascene aluminum lines produced in accordance with this invention appears to be fundamentally different to that observed for RIE aluminum lines, resulting in a different exponent for the relationship between current density and lifetime.

During an investigation leading up to this invention, aluminum lines were formed using a dual damascene technique described by L. A. Clevenger et al., *A Novel Low Temperature CVD/PVD Al Filling Process for Producing Highly Reliable 0.175 μm wiring/0.35 μm pitch Dual Damascene Interconnections in Gigabit Scale Drams*, Proceedings of the International Interconnect Technology Conference (Jun. 1998), p. 137–139. The technique is also described in R. Iggulden et al., *An Advanced 4 Level BEOL Process with 3 Levels of Minimum Pitch Dual Damascene Wiring (W, Al, Al) for 0.175 Micron Giga-Scale*, Proceedings of the LSI Multilevel Interconnection Conference (Jun. 1998), p. 19. Notably, the latter document discloses a four-level BEOL ("backend of the line") process employing a PVD Ti/CVD TiN/ CVD Al/PVD Al metallization system. However, the disclosed metallization was not formed to sufficient lengths or tested in any manner that would have indicated or even suggested the unexpected resistance saturation effect determined with this invention to occur for short line lengths.

For the investigation, a lower-level interconnect of dual damascene tungsten was formed in $SiO_2$, followed by a 900 nm thick silicon dioxide layer that served as the inter-level dielectric. For the upper-level aluminum lines, vias were etched into the inter-level dielectric. The lithography and etching of trenches for the aluminum dual damascene lines were then performed. Four dual damascene processes were evaluated using three different types of test structures. The dual damascene processes, which entailed four different diffusion barrier (liner) systems, are summarized in Table 1. Specimens of a first type of test structure (hereinafter referred to as an "open-ended" type) comprises an array of stripes having widths of about 0.3 micrometer or 0.35 micrometer, lengths of about 50 to 200 micrometers, terminated at one end with a 0.3 micrometer diameter via, and terminated on the opposite end with a connection wire of several micrometers width. Specimens of a second type ("closed-ended" type) comprised an array of stripes with widths of about 0.175 micrometer and lengths of about 200 micrometers, terminated at the cathode end with a single via and on the anode end with three vias, each with a diameter of about 0.225 micrometer. Finally, specimens of a third type ("open-ended via-up" type) comprised an array of stripes with widths of about 0.175 micrometer that widened to about 0.6 micrometer at the cathode end where a via of about 0.225 micrometer diameter connected to a second aluminum dual damascene level. These specimens had lengths of about 200 micrometers, and terminated at the anode end with a connection wire having a width of several micrometers.

For convenience, the four damascene processes are referred to by code names given in Table I. "PVD-Ti/TiN" refers to a diffusion barrier whose lower layer was PVD titanium, followed by PVD titanium nitride (TiN), CVD aluminum, and finally a conductor of CVD $AlCu_{0.5\%}$ (stated in weight percent). The specimens identified as "i-PVD-Ti" lacked a layer of TiN, and the lowermost layer of the diffusion barrier was titanium deposited by ionized PVD. The diffusion barrier of the "PVD-Ti" specimens was generally of a type employed in the art, and differed primarily from the i-PVD-Ti specimens by the method in which the titanium layer was deposited and the addition of silicon to the low-temperature aluminum layer to discourage the formation of TiAl$_3$. Finally, the "PVD-Ti/CVD-TiN" specimens employed a diffusion barrier liner within the scope of the present invention. The line comprised a layer of PVD titanium (corresponding to layer 26 of FIG. 3) and a layer of CVD TiN (corresponding to layer 28 of FIG. 3), over which a layer of CVD aluminum (corresponding to aluminum layer 30 of FIG. 3) was deposited. The AlCu$_{0.5\%}$ conductor (corresponding to conductor 32 of FIG. 3) was deposited by PVD at about 400° C. In all cases, the metallization was followed by chemical-mechanical polishing (CMP) in order to remove the metal overburden and planarize the interconnect surface.

TABLE 1

| Metallization Code | Liner Material(s) | Low-Temperature (<300° C.) Al Alloy | High-Temperature (PVD) AlCu$_{0.5\%}$ |
|---|---|---|---|
| PVD-Ti/TiN | 30 nm PVD Ti + 15 nm PVD TiN | 60 nm CVD Al | 1000 nm @ 400° C. |
| i-PVD-Ti | 40 nm i-PVD Ti | 100 nm PVD AlCu$_{0.5\%}$ | 900 nm @ 430° C. |
| PVD-Ti | 25 nm PVD Ti | 300 nm PVD AlCu$_{0.5\%}$Si$_{0.5\%}$ | 600 nm @ 525° C. |
| PVD-Ti/CVD-TiN | 30 nm PVD Ti + 10 nm CVD TiN | 60 nm CVD Al | 800 nm @ 400° C. |

The specimens formed by the investigated dual damascene processes described above were tested, and the resulting data compared to aluminum lines formed using identical substrate and interlevel dielectric materials, but by a conventional RIE process that had been optimized for patterning of 0.175 micrometer feature sizes. The vias of the RIE specimens were formed with tungsten plugs. The RIE specimens were formed by depositing about 10 nm of PVD Ti and about 20 nm of PVD TiN, followed by about 250 nm AlCu$_{0.5\%}$ deposited by PVD at a temperature of less than 150° C. These layers were then capped with a layer of Ti/TiN deposited by PVD. After the metal etch to pattern lines, the wafers are exposed to a wet clean and an anneal at about 400° C. for about 30 min. All samples were further processed by building at least one more metal level and passivating the entire wafer with SiO$_2$ and polyimide.

Electromigration testing of the above specimens was performed at about 250° C. using a current density in the range of 1 MA/cm$^2$ to 3 MA/cm$^2$, where the current density is calculated using the cross-sectional area of the aluminum lines and ignoring any TiAl$_3$ formed by the reaction of the aluminum line with the titanium content of its diffusion barrier liner. A "failure" criterion was chosen to be a resistance shift of more than 20%. Texture analysis of the test lines was also performed using electron backscatter diffraction, also known as backscatter Kikuchi diffraction, with a spatial resolution of 0.1 micrometer.

Figure 4:
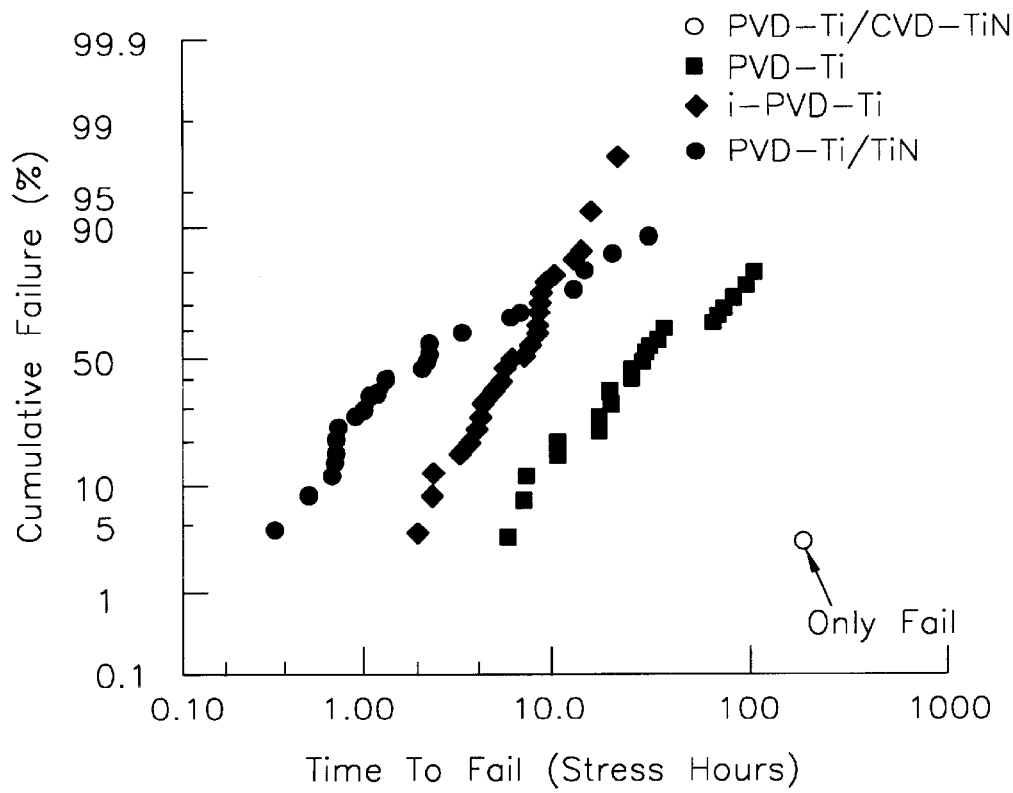
FIG. 4 is a cumulative distribution function (CDF) plot for dual damascene aluminum test lines formed by four different deposition techniques, one of which is in accordance with the present invention.
Figure 5:
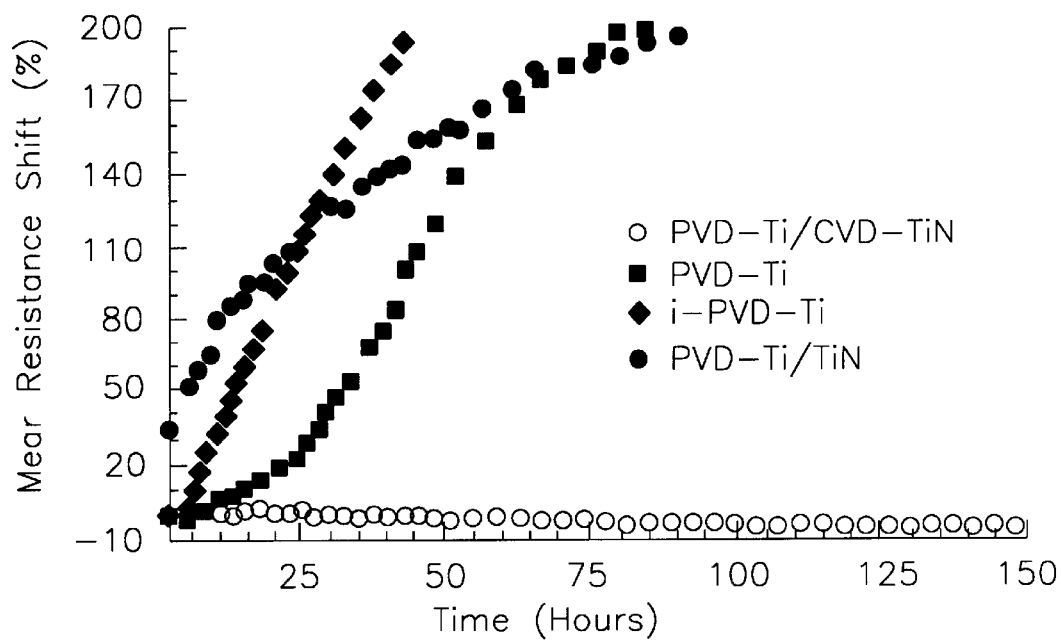
FIG. 5 is a median resistance shift plot for the four test lines of FIG. 4.

FIGS. 4 and 5 are graphs of cumulative distribution functions (CDF) plots and the median resistance shifts, respectively, for the four dual damascene processes of Table 1 using test structures of the open-ended type with 50 micrometer lengths and 0.3 micrometer widths. The applied current used to obtain the test data represented in FIGS. 4 and 5 was identical for all specimens, and corresponded to a current density of about 1.1 MA/cm$^2$ for the PVD-Ti/CVD-TiN specimens. The CDF plots of FIG. 4 evidence that there were significant differences in the electromigration lifetime of the specimens. The PVD-Ti/TiN specimens failed first, followed by the i-PVD-Ti and then the PVD-Ti specimens. The PVD-Ti/CVD-TiN specimens (having the CVD TiN layer corresponding to layer 28 of FIG. 3) had substantially longer lifetimes than the others, with the first fail occurring after about 178 hours. The test continued until 215 hours were completed without any further failure of a PVD-Ti/CVD-TiN specimen. The data underlying FIG. 4 was compiled differently to produce the graph of FIG. 5, which presents the average resistance shift for every measurement time given. While the resistance trend for the PVD-Ti/TiN initially gave rise to the largest resistance shift, after around 60 hours the mean resistance reached was only as high as that for the PVD-Ti specimens and far smaller than that for the i-PVD-Ti specimens. On the other hand, the flat mean resistance trend for the PVD-Ti/CVD-TiN specimens evidences the absence of fails for the first 150 hours of the test.

From subsequent testing of specimens of the closed-ended type and longer open-ended type (lengths greater than 50 micrometers), it became evident that the occurrence of fails for the PVD-Ti/CVD-TiN specimens depended strongly on the test structure and test conditions used. This conclusion is supported by Table 2 below, which associates current densities and length of test lines with the occurrence or nonoccurrence of a resistance increase within 100 stress hours. Generally, fails were difficult to induce in specimens of the closed-ended type, in addition to the short open-ended type specimens whose data are reported in FIGS. 4 and 5 (no fails until 178 hours). Similarly, for 200 micrometer closed-ended structures (0.175 micrometer width), most PVD-Ti/CVD-TiN specimens of either type could not be brought to fail during more than 150 stress hours provided current densities were below 2.5 MA/cm$^2$. In order to induce fails in the majority of closed-ended PVD-Ti/CVD-TiN specimens, the current density had to be increased to at least 2.5 MA/cm$^2$. On the other hand, fails were induced at current densities of less than 2.5 MA/cm$^2$ in PVD-Ti/CVD-TiN specimens with open-ended structures of 200 micrometer lengths and with 250 nm to 380 nm thick AlCu conductors. In thicker lines, however, fails appeared to be more difficult to generate.

TABLE 2

| Test Structure | Nonoccurrence of resistance increase | | | Occurrence of resistance increase | | |
|---|---|---|---|---|---|---|
| | j (MA/cm$^2$) | L ($\mu$m) | jL (A/cm) | j (MA/cm$^2$) | L ($\mu$m) | iL (A/cm) |
| Closed-ended | ≤2 | 200 | ≤40,000 | ≥2.5 | 200 | ≥50,000 |
| Open-ended | 1 | 50 | 5,000 | 1.3 | 200 | 26,000 |

Figure 6:
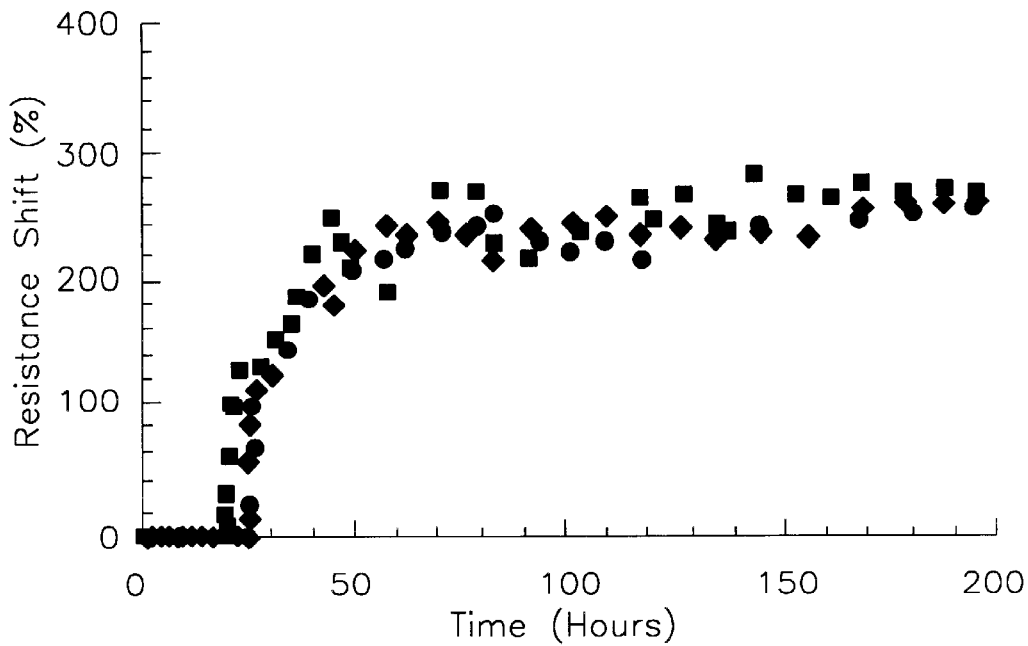
FIG. 6 is a graph representing resistance shift (%) versus time for aluminum test lines of this invention stressed at 2.5 MA/cm$^2$.

When fails were induced in PVD-Ti/CVD-TiN specimens, voids occurred predominantly in the lines and accumulated in several distinct groups. Furthermore, the resistance changed very rapidly once initiated, and tended to saturate at high values, as shown in FIG. 6. The data of FIGS. 6 is for three PVD-Ti/CVD-TiN specimens of the closed-ended type, and plots resistance shift (%) versus time for a current density of about 2.5 MA/cm$^2$. Accordingly, FIG. 6 demonstrates that the resistance increase with time saturates for the PVD-Ti/CVD-TiN specimens. In contrast, a similar behavior was not observed for RIE specimens tested under the same conditions - instead, resistance continued to increase in the RIE specimens, resulting in a shorter lifetime. SEM studies of closed-ended PVD-Ti/

CVD-TiN specimens that survived electromigration stress without significant increase in resistance revealed no voiding or deterioration of any sort. At the anode end of the test line, a significant copper pile up was identified. In some cases, the amount of copper was estimated to approximately equal the entire amount of copper present in the test line. This phenomenon for copper accumulation was concluded to be indicative of the higher drift velocity of copper as compared to aluminum through the AlCu lines.

Figure 7:
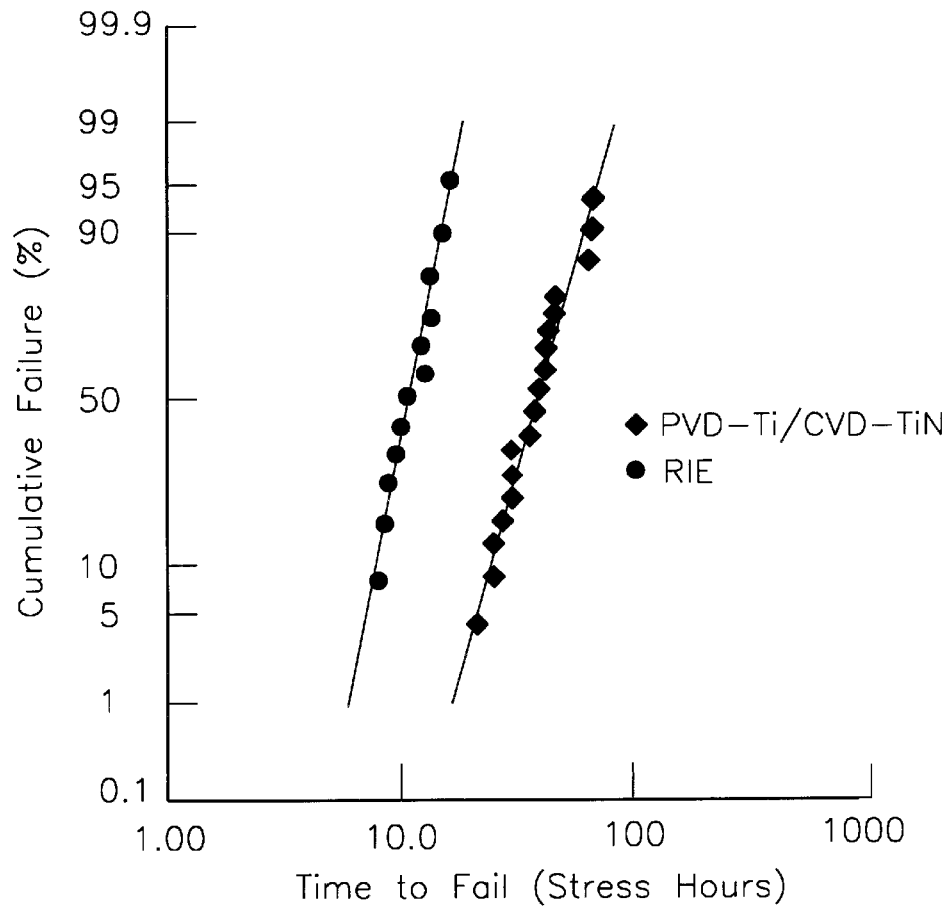
FIG. 7 is a CDF plot for aluminum test lines of this invention and aluminum test lines formed by reactive ion etching (RIE) in accordance with the prior art.
Figure 8:
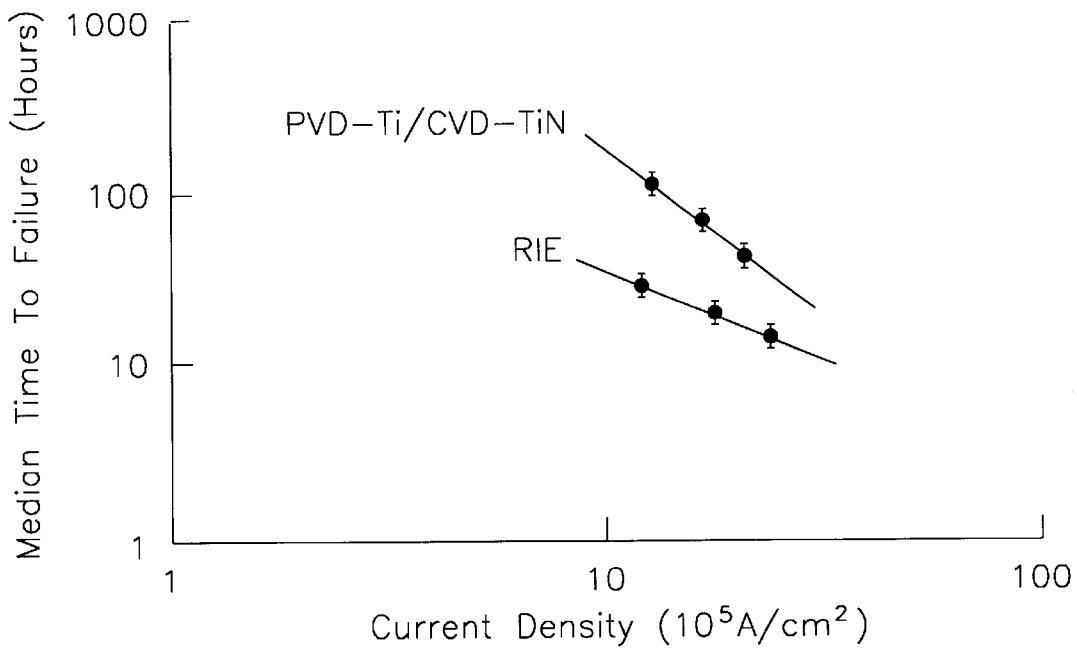
FIG. 8 is a log-log plot of the median time to failure versus the current density for aluminum test lines of this invention and aluminum test lines formed by RIE in accordance with the prior art.

FIG. 7 shows the CDF plot for a PVD-Ti/CVD-TiN specimen of the closed-ended type compared with the RIE specimens, and evidences that the median time to failure is delayed by a factor of about 3.3 for the PVD-Ti/CVD-TiN damascene specimens as compared to the RIE specimens. Significantly, when comparing FIG. 7 and FIG. 4, it becomes evident that the electromigration lifetimes of the three remaining damascene processes (PVD-Ti/TiN, i-PVD-Ti and PVD-Ti) fall short of the RIE performance. The current density for the damascene specimens had been elevated to 2.5 MA/cm$^2$ in order to assure a statistically relevant number of failures for the data of FIG. 7. Metal RIE specimens were stressed only at 1.8 MA/cm$^2$, since early failures and a bimodal failure distribution develop at higher current densities in RIE specimens. Therefore, the comparison required a normalization of the current densities, which was selected to be 2 MA/cm$^2$. Current exponents were determined based on experimental data at lower current densities, portrayed in FIG. 8 in a log-log plot of the median time to failure versus current density based on RIE structures and open-ended damascene structures having widths of about 0.35 micrometer and lengths of about 200 micrometers (the failure criterion was chosen as a resistance increase above 20%; error bars represent a 95% confidence interval). A current exponent (n) of about one was obtained for the RIE specimens and about two for the damascene specimens.

Figure 9:
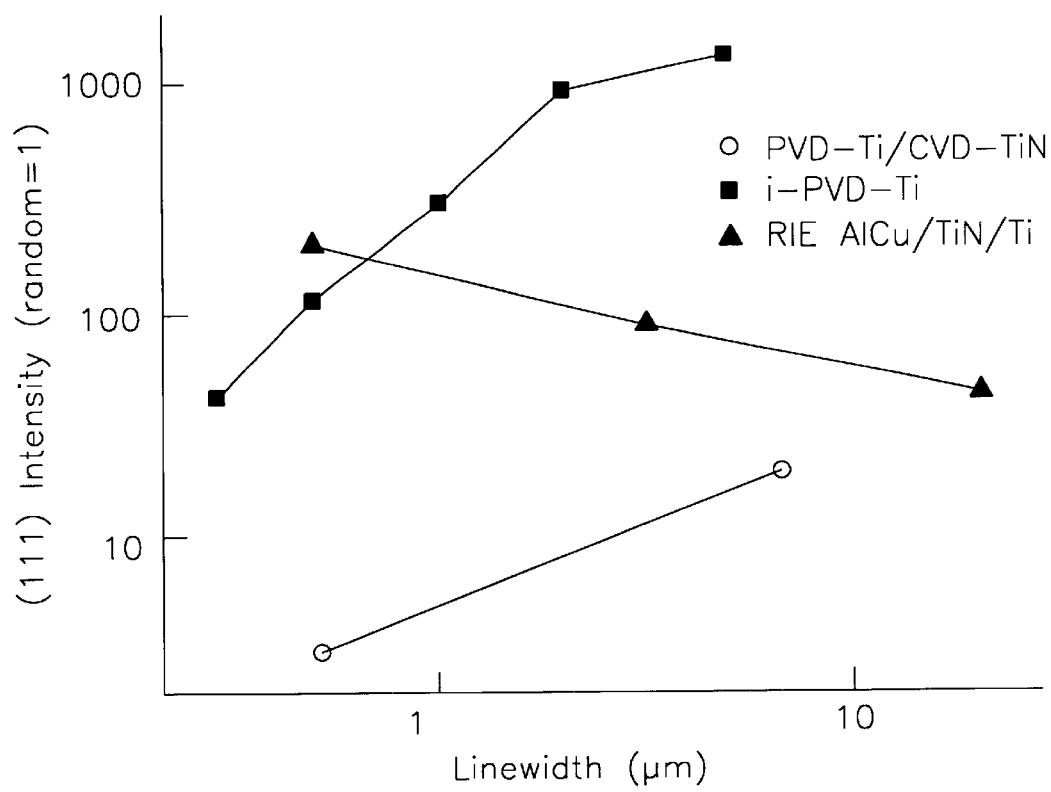
FIG. 9 is a graph comparing the electron backscatter intensity of the (111) reflection of AlCu grains of RIE aluminum lines and dual damascene aluminum lines formed by two different deposition techniques, one of which is in accordance with the present invention.

In an attempt to correlate the electromigration data with the microstructure of the metal lines, scanning electron microscopy (SEM), transmission electron microscopy (TEM) and electron backscatter diffraction were performed on some unstressed specimens. The grain size of 0.175 micrometer wide PVD-Ti/CVD- TiN specimens was addressed by TEM analysis and found to be of the order of several micrometers. A complete bamboo structure is formed with lines being entirely filled by single grains. Next, electron backscatter intensity is used as a measure of fiber texture in an array of lines. For this purpose, the intensity is integrated over an area of several square micrometers. FIG. 9 is a graph of the electron backscatter intensity of the (111) reflection of AlCu grains for the i-PVD-Ti and PVD-Ti/CVD-TiN specimens and the RIE specimens with varying line widths. The fact that the texture of the damascene lines degrades strongly with decreasing line width was attributed to an increasing contribution of material nucleated at the sidewalls of the damascene trenches. Independent of line width, the i-PVD-Ti process exhibited a stronger texture compared to the PVD-Ti/CVD-TiN process. On the other hand, the texture of specimens produced by the RIE process increased with decreasing line width. This was concluded to be caused by grain alignment during the metal anneal that followed line patterning. As evident from FIG. 9, the texture of narrow metal RIE lines exceeded that of both damascene specimens.

SEM analysis revealed (and later confirmed by TEM) that the amount of TiAl$_3$ intermetallic varied greatly between the four damascene specimens. TiAl$_3$ content was greatest for the i-PVD-Ti specimens, followed by PVD-Ti/TiN and PVD-Ti. In contrast, no detectable TiAl$_3$ content was observed in the PVD-Ti/CVD-TiN specimens. In the i-PVD-Ti, PVD-Ti/TiN and PVD-Ti specimens, TiAl$_3$ formation increased according to the thickness of the titanium layer (see Table 1). In addition to a relatively thin Ti layer in the PVD-Ti specimens, reactions between titanium and aluminum may have been further suppressed by the formation of a TiSi interface, which would form by segregation of silicon out of the AlCu$_{0.5\%}$Si$_{0.5\%}$ bulk layer. In the PVD-Ti/CVD-TiN specimens, the CVD TiN layer appeared to effectively prevent the titanium layer from reacting with the aluminum bulk layer during deposition. These findings were in agreement with previously published TEM studies. The TEM cross-section of a RIE specimen similarly revealed a small volume of TiAl$_3$ that formed at the bottom of the line.

From the above investigation, it was concluded that the lifetime ranking of three of the four damascene processes, namely i-PVD-Ti (shortest), PVD-Ti, and PVD-Ti/CVD-TiN (longest), can be roughly accounted for by the amount of the TiAl$_3$ reaction (greatest, intermediate and negligible, respectively). The reduced cross-sectional area of the unreacted AlCu presumably leads to increased current densities for the specimens stressed at a fixed current (FIGS. 4 and 5). Furthermore, the formation of TiAl$_3$ is associated with an effective volume decrease in the metal line, and consequently a tensile stress that promotes void formation. This explanation was not fully satisfactory, though, when comparing the PVD-Ti and the PVD-Ti/CVD-TiN specimens. The PVD-Ti and PVD-Ti/CVD-TiN specimens showed no significant difference in the area of the unreacted AlCu, yet had significantly different electromigration lifetimes, with PVD-Ti/CVD-TiN specimens being far superior. This led to the conclusion that the TiAl$_3$ reaction zone not only reduced the amount of the AlCu bulk material, but also provided a fast diffusion path for aluminum migration at the associated interfaces to the aluminum and titanium (or TiSi, respectively). This diffusion path would be independent of the size of the TiAl$_3$ reaction zone, instead depending on a continuous TiAl$_3$ reaction zone along the entire length (or at least along extended segments) of the line. In specimens where the TiAl$_3$ zone was strongly reduced and, if existent at all, discontinuous, aluminum migration would be significantly slowed. However, the early failures for the PVD-Ti/TiN specimens could not be explained by a reduced volume of AlCu, since these specimens exhibited a larger unreacted AlCu cross-section than the i-PVD-Ti specimens, yet exhibited the shortest electromigration lifetime. Therefore, it may be concluded that voids caused by incomplete filling further impacted the electromigration lifetime of these specimens.

Similarly to the damascene specimens, the reacted bottom titanium layer of the RIE specimens appeared to have lead to a TiAl$_3$ reaction zone that promoted electromigration both by reduction of the AlCu cross-section and formation of a fast diffusion interface. In addition, there were other differences that may have played a role in the electromigration of the RIE specimens as compared to the PVD-Ti/CVD-TiN specimens. In the case of the RIE specimens, the sidewalls of the aluminum lines would be affected by residues and interface roughness as a result of the dry etch and wet clean processes. Moreover, the reacted and/or oxidized aluminum sidewall direct contacted the surrounding silicon dioxide dielectric layer. As is well known, electromigration in bamboo structured lines takes place to a significant degree by sidewall migration and can be further accelerated if void nucleation sites are multiplied by the sidewall roughness. In the case of the damascene specimens, the silicon dioxide layer presumably formed a relatively void- free interface with the top surface of the aluminum, thereby reducing sidewall migration. For PVD-Ti/CVD-TiN specimens, the aluminum-containing CVD aluminum and PVD AlCu bulk layers contacted only the CVD TiN layer at the sidewalls. Therefore, there were presumably far fewer microscopic voids at the AlCu interfaces of the unstressed PVD-Ti/CVD-TiN specimens that could give rise to void growth during electromigration stress. Moreover, the dislocation density in the PVD-Ti/CVD-TiN specimens would be greatly decreased due to the enormous grain size of several micrometers. This in turn reduced the probability of void nucleation in the PVD-Ti/CVD-TiN specimens.

The fact that the current density exponents of the lifetime-current density relationship differed considerably between the RIE and PVD-Ti/CVD-TiN specimens indicated the existence of different failure mechanisms. In fact, voids in the RIE specimens generally formed over the tungsten studs at the cathode end, while in the PVD-Ti/CVD-TiN specimens groups of voids were formed in the lines at some distance from the cathode end, as noted earlier. In the past, a current exponent (n) of about one has sometimes been attributed to electromigration lifetimes limited by void growth, while a value of two has been associated with lifetimes limited by void nucleation. This interpretation has been questioned by arguments that values between one and two can account for void nucleation. The present investigation does not afford any bases to draw conclusions from the current exponent as for what kind of void formation mechanism accounts for the resistance increase in either case.

At a first glance, the test structure dependence for current densities required to generate a resistance increase in the PVD-Ti/CVD-TiN specimens (see Table 2) suggested the existence of a back stress effect in which the accumulation of aluminum atoms at the anode end caused a stress gradient that opposed the electromigration driving force, as has been previously reported and discussed above. However, the resulting critical product of line length and current density above which resistance increases (see Table 2) was higher by more than 10× (>40,000 A/cm) for PVD-Ti/CVD-TiN specimens as compared to values reported previously. For example, a critical product of 1700 A/cm has been reported for damascene lines of unpassivated polycrystalline Al-Cu lines, and critical products of 1020 A/cm and 1260 A/cm have been reported for RIE specimens. Although backstress arguments may explain these results, a somewhat different mechanism for the short length effects observed for this invention is as follows. The PVD-Ti/CVD-TiN specimens exhibited an extremely low density of void nucleation sites for presumably a number of reasons, such as large grain size, low dislocation density, a smooth interface between the bulk Al and the top dielectric, good bonding between CVD aluminum and CVD TiN, little volume shrinkage and small tensile stress. Furthermore, aluminum migration was reduced to extremely slow bulk diffusion due to the absence of a fast diffusion path such as grain boundaries or a continuous Al-TiAl$_3$ interface. Both the extremely dense aluminum bulk and the slower migration of atoms would prevent (or at least significantly retard) the initial formation of voids in the closed-ended or short open-ended PVD-Ti/CVD-TiN specimens. Since the initial electromigration would be effectively initially blocked, aluminum buildup at the anode end would be delayed and, consequently, no extraordinary back stress would build up along the entire length of the line. At moderate current densities voids would form only after extremely long incubation times or in long open-ended lines that allow nuclei to slowly accumulate. In closed-ended or short open-ended structures, current densities above 2 MA/cm$^2$ were required in order to accelerate the aluminum migration and obtain a measurable resistance increase before 100 stress hours. This model accounted in similar terms for the observed resistance saturation in failing PVD-Ti/CVD-TiN specimens (FIG. 6), since void growth would be blocked in the same way as initial void nucleation by the slow diffusivity within the conductor. This same model would account for the superiority of the PVD-Ti/CVD-TiN specimens over RIE structures as well as damascene lines with TiAl$_3$, since the extremely dense Al bulk and the absence of a fast migration path were unique to the PVD-Ti/CVD-TiN specimens.

While the absence of a reaction zone left the AlCu bulk of the PVD-Ti/CVD-TiN specimens intact, it resulted at the same time in a comparatively thin redundancy layer. This would explain the very rapid resistance increase in failing specimens. The fact that the current density needed to be elevated to comparatively high values would further accelerate the void formation once the end of the resistance incubation time is reached.

As discussed above, a strong AlCu texture did not correlate with a long electromigration lifetime in the damascene specimens. Instead, the PVD-Ti/CVD-TiN specimens that exhibited the best electromigration performance had the weakest texture. It has been reported previously that a correlation exists between the formation of TiAl$_3$ and a pronounced texture of the AlCu grains. As for the RIE specimens, the electromigration of two-level bamboo structures reportedly does not strongly depend on the AlCu texture. On the other hand, there are many indications that AlCu grain texture plays a role in one level structures that are not entirely of bamboo type.

On the basis of the investigation, it can be seen that the electromigration lifetime of two-level AlCu dual damascene lines having a diffusion barrier of PVD-Ti/CVD-TiN in combination with a layer of CVD aluminum and PVD AlCu is far superior to those of similar AlCu dual damascene lines having different diffusion barrier structures and processes. Furthermore, dual damascene aluminum lines with a PVD-Ti/CVD-TiN diffusion barrier are capable of exhibiting a substantially longer electromigration lifetime than aluminum lines formed by conventional RIE processing, though other dual damascene processes exhibited inferior electromigration lifetime as compared to the RIE process. Surprisingly, the superior PVD-Ti/CVD-TiN process exhibited an almost random texture for narrow lines, evidencing that a pronounced texture is not a prerequisite for short electromigration lifetime in bamboo damascene lines, a conclusion contrary to conventional wisdom.

While various explanations are offered above for the superior performance of the PVD-Ti/CVD-TiN specimens, the invention is not limited to such explanations. Furthermore, while the invention has been described in terms of particular embodiments and with reference to specific test specimens, it is apparent that other forms could be adopted by one skilled in the art. Accordingly, the scope of the invention is to be limited only by the following claims.

What is claimed is:

1. A method of forming a dual damascene metallization structure of a multilevel microelectronic device, the device containing the dual damascene metallization structure in a first level thereof, two electrically-conductive regions in a second level thereof and electrically interconnected by the dual damascene metallization structure, and a dielectric layer separating the first and second levels of the device, the dual damascene metallization structure having a line portion with a length of greater than 100 micrometers and at least two filled vias by which the dual damascene metallization structure is terminated at opposing ends thereof by the electrically-conductive regions, the dual damascene metallization structure being formed by a dual damascene process comprising the steps of:

forming vias through the dielectric layer to each of the electrically-conductive regions;

forming a trench contiguous with the first and second vias but not through the dielectric layer; and filling the trench and the first and second vias by:

depositing a layer of titanium by physical vapor deposition on surfaces of the dielectric layer within the vias and the trench and on surfaces of the electrically- conductive regions exposed within the vias;

depositing a layer of titanium nitride by chemical vapor deposition on the layer of titanium, the layer of titanium nitride being separated from the dielectric layer and the electrically-conductive regions by the layer of titanium;

depositing a layer of aluminum by chemical vapor deposition on the layer of titanium nitride, the layer of aluminum being separated from the layer of titanium by the layer of titanium nitride; and depositing an aluminum-containing alloy by physical vapor deposition on a surface of the layer of aluminum so that the aluminum-containing alloy is separated from the dielectric layer and the electrically-conductive regions by the layers of titanium, titanium nitride and aluminum;

wherein the layers of titanium and titanium nitride define a diffusion barrier that terminates and separates the layer of aluminum and the aluminum-containing alloy from the two electrically-conductive regions.

2. A method according to claim 1, wherein the aluminum-containing conductor is formed of an aluminum-copper alloy.

3. A method according to claim 1, wherein the layers of titanium and titanium nitride are each thinner than the layer of aluminum, and the aluminum-containing alloy is deposited to a thickness greater than the combined thicknesses of the layers of titanium, titanium nitride and aluminum.

4. A method according to claim 1, wherein the aluminum-containing alloy is characterized by a random grain texture.

5. A method according to claim 1, wherein the aluminum-containing alloy is substantially free of titanium aluminide.

6. A method according to claim 1, wherein the dual damascene metallization structure has a length between the opposing ends of about 100 to 300 micrometers.

7. A method according to claim 1, wherein the two electrically-conductive regions are formed of tungsten.

8. A method according to claim 1, wherein the electrically-conductive regions are dual damascene interconnect metallizations.

9. A method according to claim 8, wherein each of the interconnect metallizations is formed by a method comprising the steps of:

forming a trench;

depositing a layer of titanium by physical vapor deposition on a surface of the trench;

depositing a layer of titanium nitride by chemical vapor deposition on the layer of titanium, the layer of titanium nitride being separated from the surface of the trench by the layer of titanium;

depositing a layer of aluminum by chemical vapor deposition on the layer of titanium nitride, the layer of aluminum being separated from the layer of titanium by the layer of titanium nitride; and depositing an aluminum-containing alloy by physical vapor deposition on the layer of aluminum.

10. A method according to claim 1, further comprising the step of subjecting the dual damascene metallization structure to a current density of up to 2 MA/cm$^2$ at a temperature of 250° C. without exhibiting a resistance shift after a period of 100 hours.

11. A method according to claim 10, wherein the dual damascene metallization structure has a critical (current density)×(line length) product of at least 10,000 to 40,000 A/cm.

12. A method of forming a dual damascene metallization structure of a multilevel microelectronic device, the device containing the dual damascene metallization structure in a first level thereof, two electrically-conductive regions in a second level thereof and electrically interconnected by the dual damascene metallization structure, and a dielectric layer separating the first and second levels of the device, the dual damascene metallization structure having a line portion with a length of at least 200 micrometers and at least two filled vias by which the dual damascene metallization structure is terminated at opposing ends thereof by the electrically-conductive regions, the dual damascene metallization structure being formed by a dual damascene process comprising the steps of:

forming vias through the dielectric layer to each of the electrically-conductive regions;

forming a trench contiguous with the first and second vias but not through the dielectric layer, and filling the trench and the first and second vias by:

depositing a layer of titanium by physical vapor deposition on surfaces of the dielectric layer within the vias and the trench and on surfaces of the electrically- conductive regions exposed within the vias;

depositing a layer of titanium nitride by chemical vapor deposition on the layer of titanium, the layer of titanium nitride being separated from the dielectric layer and the electrically-conductive regions by the layer of titanium;

depositing a layer of aluminum by chemical vapor deposition on the layer of titanium nitride, the layer of aluminum being separated from the layer of titanium by the layer of titanium nitride; and depositing an aluminum-containing alloy by physical vapor deposition on a surface of the layer of aluminum so that the aluminum-containing alloy is separated from the dielectric layer and the electrically-conductive regions by the layers of titanium, titanium nitride and aluminum;

wherein the layers of titanium and titanium nitride define a diffusion barrier that terminates and separates the layer of aluminum and the aluminum-containing alloy from the two electrically-conductive regions; and wherein the dual damascene metallization structure has a critical (current density)×(line length) product of at least 10,000 to 40,000 A/cm.

* * * * *